United States Patent
Adachi et al.

(10) Patent No.: US 7,067,205 B2
(45) Date of Patent: Jun. 27, 2006

(54) THERMOELECTRIC TRANSDUCING MATERIAL, AND METHOD FOR PRODUCING THE SAME

(75) Inventors: Hideaki Adachi, Hirakata (JP); Akihiro Odagawa, Tsuchiura (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/730,096

(22) Filed: Dec. 9, 2003

(65) Prior Publication Data

US 2004/0115464 A1  Jun. 17, 2004

Related U.S. Application Data

(63) Continuation of application No. PCT/JP03/03787, filed on Mar. 27, 2003.

(30) Foreign Application Priority Data

Apr. 9, 2002 (JP) ............................. 2002-106175

(51) Int. Cl.
 *B32B 18/00* (2006.01)
(52) U.S. Cl. ............... 428/701; 428/702; 428/697; 428/699; 136/205; 136/236
(58) Field of Classification Search ........ 428/701, 428/702, 697, 699; 136/205, 236; 252/519; 423/263, 594
See application file for complete search history.

(56) References Cited

U.S. PATENT DOCUMENTS 6,555,269 B1* 4/2003 Cho et al. ............... 429/231.1
2002/0157699 A1* 10/2002 Ichinose et al. ......... 136/236.1

FOREIGN PATENT DOCUMENTS

| JP | 9-321346 | 12/1997 |
| JP | 2000-211971 | 8/2000 |
| JP | 2001-284662 | 10/2001 |
| JP | 2001-320095 | 11/2001 |

OTHER PUBLICATIONS

R. Venkatasubramanian et al., Thin-film thermoelectric devices with high room-temperature figures of merit, Nature, vol. 413, Oct. 11, 2001, pp. 597-602.

* cited by examiner

*Primary Examiner*—Jennifer McNeil
*Assistant Examiner*—G. Blackwell
(74) *Attorney, Agent, or Firm*—McDermott Will & Emery LLP

(57) ABSTRACT

A thermoelectric transducing material according to this invention includes a layered cobaltite based substance represented by the chemical formula $A_xCoO_2$, wherein A consists of an element or element group selected from alkali metal elements and alkali earth group elements and is compositionally modulated in a thickness-wise direction of layers in a structure of the layered cobaltite based substance.

23 Claims, 3 Drawing Sheets

| A' ELEMENT | A" ELEMENT | THERMOELECTRIC TRANSDUCTION POWER FACTOR P   mW/K$^2$ m |
|---|---|---|
| Na | K | 1.3 |
| Na | Ca | 1.8 |
| Na | Sr | 2.2 |
| Na | Ba | 1.7 |
| K | Ca | 1.5 |
| K | Sr | 1.8 |
| K | Ba | 1.6 |
| Ca | Sr | 1.2 |
| Ca | Ba | 1.1 |
| Sr | Ba | 1.2 |

Fig. 3

THERMOELECTRIC TRANSDUCING MATERIAL, AND METHOD FOR PRODUCING THE SAME

This is a continuation application under 35 U.S.C 111(a) of pending prior International application No. PCT/JP03/03787, filed on Mar. 27, 2003.

BACKGROUND OF THE INVENTION

1. Field of the Invention

The present invention relates to a thermoelectric transducing material for forming a thermoelectric transducer adapted to perform thermoelectric cooling or thermoelectric power generation, and a method for producing the same.

2. Description of the Related Art

A thermoelectric transducer has a structure in which a certain number of pairs of junctions are formed by alternately joining a plurality of p-type thermoelectric transducing material and n-type thermoelectric transducing material, charge carriers of which are positive and negative, respectively, and one of each pair of junctions which forms, for example, pn junction along a current flowing direction and the other of each pair of junctions which forms, for example, np junction along the current flowing direction are spaced apart from each other. The thermoelectric transducer is used to cool by producing a temperature difference between junction regions according to electric current flowing therethrough or to generate electric power by generating electromotive force by providing a temperature difference between the junction regions. Heretofore, study has been made mainly of semiconductor materials such as Bi—Te, Pb—Te and Si—Ge as thermoelectric transducing materials, and some of them are being put to practical use in specific fields.

However, the performance of such a material is still insufficient to lead to full practical use in general consumer products and, hence, a thermoelectric transducing material exhibiting improved performance has been desired.

Recently, among oxide materials which have been considered unsuitable for thermoelectric materials, there have been found substances exhibiting high thermoelectric transducing performance characteristic such as layered cobaltite (of layered bronze structure) based $Na_yCoO_2$ (y=0.2 to 1) (see Japanese Patent Laid-Open Publication No. HEI 9-321346). Though system of this type exhibit thermoelectric transducing performance close to that of Bi—Te, which is a semiconductor material of practical level, it is not yet clarified why such oxides exhibit high thermoelectric transducing performance characteristic. It is possible that the thermoelectric characteristic developing mechanism of such an oxide is different from that of a conventional thermoelectric semiconductor. If so, oxide materials of this type can be expected to exhibit higher thermoelectric transducing performance characteristic than conventional thermoelectric semiconductors.

SUMMARY OF THE INVENTION

It is an object of the present invention to provide a thermoelectric transducing material comprising an oxide material, which has a higher thermoelectric transducing performance characteristic, and a method for producing the same.

With a view to attaining this object, the present invention provides a thermoelectric transducing material comprising a layered cobaltite based substance represented by the chemical formula $A_xCoO_2$, wherein A consists of an element or element groups selected from alkali metal elements and alkali earth group elements and is compositionally modulated in a thickness-wise direction of layers in a structure of the layered cobaltite based substance. Here, a value of x representing a composition ratio of A is preferably not less than 0.2 and not more than 1. This constitution has realized a layered cobaltite based thermoelectric transducing material that is more excellent in thermoelectric transducing performance than a conventional thermoelectric transducing material comprising $Na_yCoO_2$. Though it is not clear why such a compositional modulation of A results in improved thermoelectric transducing performance, it can be conceived that movements of strongly correlated electrons, which are characteristic of this type of oxide material, are influenced at an interface of compositional modulation, which leads to an increase in thermoelectromotive force or a decrease in electrical resistance.

More preferably, the value of x representing a composition ratio of A is not less than 0.3 and not more than 0.7. With such a feature, the thermoelectric transducing material exhibits more improved thermoelectric transducing performance.

Further more preferably, the value of x representing a composition ratio of A is not less than 0.4 and not more than 0.6. With such a feature, the thermoelectric transducing material exhibits further more improved thermoelectric transducing performance.

The thermoelectric transducing material may comprise plural kinds of elements or element groups as A and A may be compositionally modulated by layering of $A_xCoO_2$ layers corresponding to the respective kinds of elements or element groups.

Preferably, the layering of $A_xCoO_2$ layers corresponding to the respective kinds of elements or element groups is repeated in a layering direction. This feature enables the thermoelectric transducing performance characteristic to develop markedly.

Preferably, the thermoelectric transducing material comprises plural kinds of elements or element groups including an alkali metal element as A and an alkali earth group element. It has been confirmed that the thermoelectric transducing material having such a feature sometimes exhibits performance comparable to or higher than that of Bi—Te, which is a conventional thermoelectric semiconductor material.

The thermoelectric transducing material may comprise two kinds of elements or element groups constituting A' and A" as A, and A may be compositionally modulated by layering an $A'_xCoO_2$ layer and an $A''_xCoO_2$ layer. The thermoelectric transducing material having such a feature has a relatively simple structure and hence is easy to produce with high reproducibility.

Preferably, A' is an element or element group consisting of an alkali metal element, while A" is an element or element group consisting of an alkali earth group element. With such a feature, the thermoelectric transducing material may have a thermoelectric transduction power factor P of 1.5 $mW/K^2m$ or more.

Preferably, a thermoelectric transduction power factor P is 1.5 $mW/K^2m$ or more.

It is preferable that A' is an element or element group consisting of an alkali metal element and a thickness of the $A'_xCoO_2$ layer is not less than 1 nm and not more than 3 nm. With such a feature, the thermoelectric transducing material may have a thermoelectric transduction power factor P of 2 $mW/K^2m$ or more.

It is preferable that A" is an element or element group consisting of an alkali earth group element and a thickness of the $A''_xCoO_2$ layer is not less than 2 nm and not more than 8 nm. With such a feature, the thermoelectric transducing material may have a thermoelectric transduction power factor P of 2 mW/K²m or more.

It is preferable that A' is an element or element group consisting of an alkali metal element and a thickness of the $A'_xCoO_2$ layer is not less than 1 nm and not more than 3 nm, while A" is an element or element group consisting of an alkali earth group element and a thickness of the $A''_xCoO_2$ layer is not less than 2 nm and not more than 8 nm. With such a feature, the thermoelectric transduction power factor P takes on a particularly excellent value.

Preferably, the the thermoelectric transduction power factor P is 2 mW/K²m or more.

A' may be Na and A" may be Sr.
A' may be Na and A" may be K.
A' may be Na and A" may be Ca.
A' may be Na and A" may be Ba.
A' may be K and A" may be Ca.
A' may be K and A" may be Sr.
A' may be K and A" may be Ba.
A' may be Ca and A" may be Sr.
A' may be Ca and A" may be Ba.
A' may be Sr and A" may be Ba.

According to the present invention, there is also provided a method for producing a thermoelectric transducing material comprising a layered cobaltite based substance represented by the chemical formula $A_xCoO_2$ wherein A is an element or element group selected from alkali metal elements and alkali earth group elements, the method comprising forming a structure of the layered cobaltite based substance with use of a plurality of evaporation sources during an electro-discharge process and compositionally modulating A in a thickness-wise direction of layers in the structure of the layered cobaltite based substance. The method of such a constitution enables the thermoelectric transducing material to be formed as a deposited thin film during the non-thermal-equilibrium electro-discharge process, thereby constructing the structure of the layered cobaltite based substance as a layered structure having excellent crystallinity.

The plurality of evaporation sources may include two or more different kinds of layered cobaltite based substances.

The electro-discharge process is preferably ion impact vapor deposition. This feature makes it possible to form a film of high quality.

The foregoing and other objects, features and advantages of the present invention will become apparent from the following detailed description of the preferred embodiments to be read with reference to the accompanying drawings.

BRIEF DESCRIPTION OF THE DRAWINGS

FIG. 3 is a table showing the relationship between a combination of A' element and A" element and a value of thermoelectric transduction power factor P measured at room temperature.

DETAILED DESCRIPTION OF THE PREFERRED EMBODIMENTS

Hereinafter, a mode for carrying out the present invention will be described with reference to the drawings.

Mode For Carrying Out the Invention

The mode for carrying out the present invention specifically describes a thermoelectric transducing material and a method for producing the same.

Figure 1:
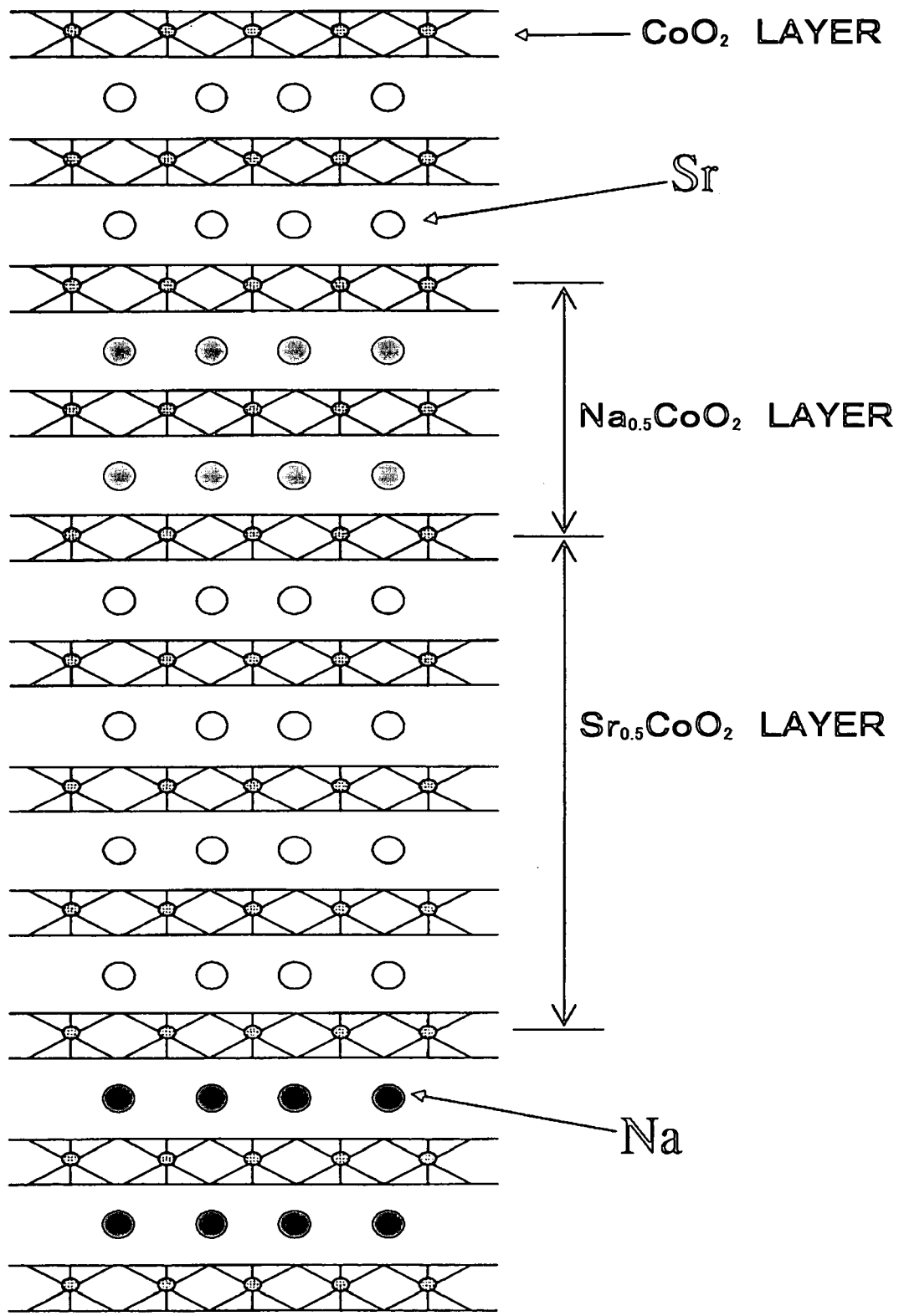
FIG. 1 is a schematic view illustrating the crystal structure of an exemplary thermoelectric transducing material according to a mode for carrying out the present invention.

FIG. 1 is a schematic view illustrating the crystal structure of an exemplary thermoelectric transducing material according to the mode for carrying out the present invention.

Referring to FIG. 1, the thermoelectric transducing material according to the mode for carrying out the invention comprises a layered cobaltite based substance represented by the chemical formula $A_xCoO_2$, wherein A is compositionally modulated in a thickness-wise direction of layers in a structure of the layered cobaltite based substance. Here, A is an element or element group selected from alkali metal elements and alkali earth group elements and x represents the composition ratio of A to Co.

The expression "A is compositionally modulated in a thickness-wise direction of layers in a structure of the layered cobaltite based substance", as used in the present specification, means that the composition of A relative to Co varies in the thickness-wise direction of the layers in a structure of the layered cobaltite based substance. Further, the expression "the composition of A relative to Co varies in the thickness-wise direction of the layers in a structure of the layered cobaltite based substance" is meant to include both of the possible modes (1) and (2): (1) A comprises two or more different kinds of elements and the element constituting A changes in the thickness-wise direction of the layers; and (2) A comprises one or more elements and the composition ratio of A to Co (i.e. x) varies in the thickness-wise direction of the layers. When (1) and (2) are compared to each other, (1) is preferable from the viewpoint of easiness of production.

A specific example of (1) is a mode wherein for example a layer of $Na_{0.5}CoO_2$ and a layer of $Sr_{0.5}CoO_2$ are layered (preferably, two such layers are layered on each other alternately), as shown in FIG. 1. In the case of (1), x may be constant (0.5 in the aforementioned example) or vary in the thickness-wise direction of the layers, but A necessarily needs to comprise two or more kinds of elements (Na and Sr in the aforementioned example).

Though not shown, a specific example of (2) is a mode wherein for example a layer of $Na_{0.2}CoO_2$, a layer of $Na_{0.3}CoO_2$, a layer of $Na_{0.4}CoO_2$ and a layer of $Na_{0.5}CoO_2$ are layered. In the case of (2), A may comprise either one kind of element or two or more kinds of elements, but x necessarily needs to vary in the thickness-wise direction of the layers.

In either case of (1) and (2), when x varies in the thickness-wise direction, it is preferable that x varies as continuously as possible in the thickness-wise direction of the layers.

Thus, according to the above-described definition, it is not required that a variation (profile) of the composition ratio of A to Co in the thickness-wise direction repeats in the thickness-wise direction. However, an actual thermoelectric transducing material having such a repeating structure exhibits an outstanding thermoelectric transducing performance characteristic and, hence, the thermoelectric transducing material of the present invention desirably has such a repeating structure.

In the thermoelectric transducing material, A comprises two kinds of elements or element groups represented by A' and A", and an A'$_x$CoO$_2$ layer and an A"$_x$CoO$_2$ layer are layered. In the thermoelectric transducing material shown in FIG. 1, A comprises Na and Sr as A' element and A" element, respectively, and a Sr$_{0.5}$CoO$_2$ layer and a Na$_{0.5}$CoO$_2$ layer are layered. Here, two-dimensionally arranged A elements (A' elements or A" elements (Na or Sr in FIG. 1) and a CoO$_2$ layer constitute a "layer", as used herein, in a structure of the layered cobaltite based substance. Accordingly, four "layers" of Sr$_{0.5}$CoO$_2$ and two "layers" of Na$_{0.5}$CoO$_2$ are layered in FIG. 1. However, the "layer" is used only conceptually and the number of "layers" does not determine the constitution of A$_x$CoO$_2$ layer (including Sr$_{0.5}$CoO$_2$ layer and Na$_{0.5}$CoO$_2$ layer in FIG. 1). The constitution of A$_x$CoO$_2$ layer is determined by the thickness of each "layer". In FIG. 1, each Na$_{0.5}$CoO$_2$ layer has a thickness of 1 nm while each Sr$_{0.5}$CoO$_2$ layer has a thickness of 2 nm. This layered structure repeats in the layering direction and the entirety of the "layers" thus repeatedly layered constitutes the thermoelectric transducing material. The thermoelectric transducing material of FIG. 1 has a structure in which the Na element in a thermoelectric transducing material made of Na$_x$CoO$_2$, which is known as a layered cobaltite based substance having a high thermoelectric transducing performance characteristic, is partially replaced with an alkali earth group element (Sr in FIG. 1). Such a structure further improves the thermoelectric transducing performance characteristic as compared to Na$_x$CoO$_2$. Though the boundary between adjacent A$_x$CoO$_2$ layers is shown definitely in the crystal structure of the thermoelectric transducing material schematically illustrated in FIG. 1, Sr$_{0.5}$CoO$_2$ of each Sr$_{0.5}$CoO$_2$ layer and Na$_{0.5}$CoO$_2$ of an adjacent Na$_{0.5}$CoO$_2$ layer are actually diffused into each other in the boundary portion between the Sr$_{0.5}$CoO$_2$ layer and the Na$_{0.5}$CoO$_2$ layer by heating during production and, hence, the boundary therebetween is indefinite. The thermoelectric transducing material according to the mode for carrying out the present invention may have such an indefinite boundary between different A$_x$CoO$_2$ layers, resulting in the composition of A element varying continuously in the layering direction. However, a thermoelectric transducing material in which the boundary between different A$_x$CoO$_2$ layers is definite and the composition of A is varied continuously in the layering direction, is more excellent in thermoelectric transducing performance characteristic and hence is more preferable.

Next, description will be made of data evidencing the advantage of compositional modulation characterizing the present invention.

Here, study was made of a case where an alkali metal element and alkali earth group elements were used as the element or element group constituting A, the alkali metal element being Na, the alkali earth group elements being two kinds of elements, i.e. Sr and Ca.

First, a c-axis oriented thin film of (NaSrCa)$_{0.5}$CoO$_2$ as a layered cobaltite based substance was formed on the c-plane of a sapphire substrate heated to 700°C by high frequency sputtering using (NaSrCa)$_{0.5}$CoO$_2$ having a chemical composition of Na:Sr:Ca=1:1:1 as a target. That is, a thermoelectric transducing material having a structure of a layered cobaltite based substance in which the element group constituting A was not compositionally modulated in the thickness-wise direction of the film (layer) was produced. With use of a mixed gas comprising argon and oxygen at a composition ratio of 1:1 as a sputter gas and with the pressure of the sputter gas being maintained at 5 Pa, the film was formed to a thickness of 600 nm in 30 minutes by induction of high-frequency discharge of 13.56 MHz with an electric power of 100 W inputted.

The thermoelectric transducing material thus produced was evaluated as to its thermoelectric transducing performance characteristic. The thermoelectric transducing performance characteristic was evaluated in terms of electric resistivity, thermoelectromotive force and thermoelectric transduction power factor P. Here, thermoelectric trasduction power factor P is defined as the quotient obtained by dividing the square of a thermoelectromotive force by a resistivity. According to the evaluation, the electric resistivity at room temperature was 4 mΩcm and the thermoelectromotive force was 150 µV/K. The thermoelectric trasduction power factor P calculated therefrom was P~0.7 mW/K$^2$m, which is slightly better than that of a conventional thermoelectric transducing material made of Na$_y$CoO$_2$ ceramic.

Next, successive layering were performed by means of multiple source sputtering with plural evaporation sources using three targets made of Na$_{0.5}$CoO$_2$, Sr$_{0.5}$CoO$_2$ and Ca$_{0.5}$CoO$_2$, respectively, thereby a thermoelectric transducing material constituted by a layered cobaltite based substance which was compositionally modulated in the c-axis direction, namely, in the layering direction was formed. Specifically, on the c-plane of a sapphire substrate heated to 700°C, 2 nm-thick layers of Na$_{0.5}$CoO$_2$, Sr$_{0.5}$CoO$_2$ and Ca$_{0.5}$CoO$_2$ were layered in this sequence repeatedly until 100 cycles of this sequence was completed, thereby compositionally modulating the element constituting A in the thickness-wise direction. The thermoelectric transducing material thus produced was evaluated as to its thermoelectric transducing performance characteristic.

According to the results of evaluation, this thermoelectric transducing material exhibited an enhanced thermoelectromotive force of 250 µV/K and was estimated to have a thermoelectric trasduction power factor P of P~2 mW/K$^2$m, though not so different in resistivity from the former thermoelectric transducing material which was not compositionally modulated. Thus, the thermoelectric transducing material according to the present invention was confirmed to have a thermoelectric transducing performance characteristic as excellent as that of Bi—Te, which is a thermoelectric semiconductor having been put to practical use. Thus, it was confirmed that the excellent thermoelectric transducing performance characteristic of the thermoelectric transducing material according to the mode for carrying out the present invention was obtained not by selecting the alkali metal element and the alkali earth group elements as A but by forming A by the alkali metal element and the alkali earth group elements and compositionally modulating thus formed A in the layering direction.

The following description is directed to simplification of compositional modulation. Though triple-source sputtering was needed to achieve compositional modulation based on the repeatedly layered structure of the aforementioned three kinds of A element (hereinafter referred to as "three-layer stacked compositional modulation"), in such triple-source sputtering, it is not easy to set timing or the like for performing layering of good quality. For this reason, double-source sputtering capable of easily layering with good quality was performed to achieve compositional modulation based on a repeatedly layered structure of two kinds of elements or element groups constituting A (hereinafter referred to as "two-layer stacked compositional modulation"). Specifically, Na$_{0.5}$CoO$_2$ layer and (SrCa)$_{0.5}$CoO$_2$ layer having respective thicknesses of 2 nm and 4 nm were alternately layered by the double-source sputtering. The resulting thermoelectric transducing material thus compositionally modulated was estimated to have a thermoelectric trasduction power factor P of P~1.8 mW/K$^2$m. Though this value is slightly lower than that obtained by the aforementioned three-layer stacked compositional modulation, the two-layer stacked compositional modulation is advantageous in that it can improve the troublesomeness and reproducibility of the production process based on the three-layer stacked compositional modulation. Thus, the two-layer stacked compositional modulation was confirmed to be preferable in terms of stabilized production of thermoelectric transducing material.

Description will be made of a method for producing a thermoelectric transducing material according to the mode of carrying out the present invention.

The thermoelectric transducing material according to the mode of carrying out the present invention has a layered structure that is unique to layered cobaltite based substances. Though such a layered structure can be constructed by a ceramic production process (thermal equilibrium process) based on a burning process under special conditions, it can be easily constructed by a thin film forming process. Further, since such a thin film forming process makes it possible to realize compositional modulation readily, the thin film forming process is preferable. The thin film forming process was found to be capable of constructing a structure of a layered cobaltite based substance particularly where a process using plural evaporation sources during electro-discharge is employed. Though $A_xCoO_2$, which is a layered cobaltite based substance, is present not so stably in an extensive range of the composition of the element or element group constituting A, control over multiple evaporation sources during electro-discharge has made it possible to realize compositional modulation with high reproducibility. Conceivably, this is because a non-thermal equilibrium process like an electro-discharge process is effective in freezing a metastable structure of this type.

Control over multiple evaporation sources using a process generating an active reaction species such as ozone, radical or atomic oxygen as an electro-discharge process, is also suitable in realizing a layered structure of a layered cobaltite based substance and compositional modulation in the layering direction of the structure. Utilization of plasma plume by laser impact or utilization of plasma CVD method also makes it possible to realize the aforementioned layered structure and compositional modulation as in the former case. Particularly, utilization of ion impact vapor deposition under reduced pressure, a representative of which is sputtering, was confirmed to be capable of easily producing a thermoelectric transducing material with high reproducibility.

As to the composition ratio x of A to Co in a layered cobaltite based substance $A_xCoO_2$ (hereinafter referred to as "A composition ratio"), the thermoelectric transducing material of the present invention can exhibit thermoelectric transducing performance in an extensive range of A composition ratio x. It was also confirmed that a range of A composition ratio x allowing the thermoelectric transducing material to exhibit particularly excellent thermoelectric transducing performance was not less than 0.2 and not more than 1. The A composition ratio x is more preferably not less than 0.3 and not more than 0.7, further more preferably not less than 0.4 and not more than 0.6. Besides sapphire, use may be made of various materials including other single crystals, ceramics and metals as the material for the substrate. Use of such a material can obtain the same advantage as can be obtained by the use of sapphire.

Next, the mode for carrying out the present invention will be described specifically by way of examples.

EXAMPLE 1

In this example plural thermoelectric transducing materials, which were compositionally modulated based on two-layer stacked compositional modulation by double-source sputtering, were produced by changing the kind of element constituting A. These materials were compared to each other as to thermoelectric transducing performance characteristic.

A of a layered cobaltite based substance $A_{0.5}CoO_2$ was constituted by two kinds of elements A' and A" and two kinds of elements were selected, as elements A' and A", from the group of Na, K, Ca, Sr and Ba consisting of alkali metal elements and alkali earth group elements. $A'_{0.5}CoO_2$ layer and $A''_{0.5}CoO_2$ layer each having a thickness of 3 nm were alternately layered on the c-plane of a sapphire substrate heated to 700°C to produce a thermoelectric transducing material made of a thin film having a thickness of 600 nm. This thermoelectric transducing material was c-axis oriented and was compositionally modulated in the thickness-wise direction by the use of the two kinds of elements, A' element and A" element, as A element. The relationship between each combination of A' element and A" element and the corresponding thermoelectric trasduction power factor P measured at room temperature is shown in FIG. 3.

Any one of combinations of A' element and A" element realized a thermoelectric trasduction power factor P of 1 mW/K$^2$m or more, which is an excellent characteristic. Particularly where a combination of A' element and A" element consisted of a combination of an alkali metal element (Na or K) and an alkali earth group element (Ca, Sr or Ba), the thermoelectric trasduction power factor P obtained was 1.5 mW/K$^2$m or more. From this fact, it was confirmed that such a combination was capable of providing a particularly excellent thermoelectric transducing material.

EXAMPLE 2

In this example, study was made of a preferable range of the thickness of each $A_xCoO_2$ layer forming a thermoelectric transducing material.

Specifically, thermoelectric transducing materials formed by a combination of $Na_{0.5}CoO_2$ and $Sr_{0.5}CoO_2$ as $A_xCoO_2$ which respectively exhibit an excellent thermoelectric transducing performance characteristic were used as samples. The correlation between the thickness of each layer and the corresponding thermoelectric trasduction power factor P was studied. These thermoelectric transducing materials, which were different in layer thickness from each other, were produced in a similar manner as in example 1.

When, for example, 1 nm-thick $Na_{0.5}CoO_2$ layer and 2 nm-thick $Sr_{0.5}CoO_2$ layer are layered, a compositionally modulated structure based on two-layer stacked compositional modulation using Na and Sr is constructed as schematically illustrated in FIG. 1.

Figure 2:
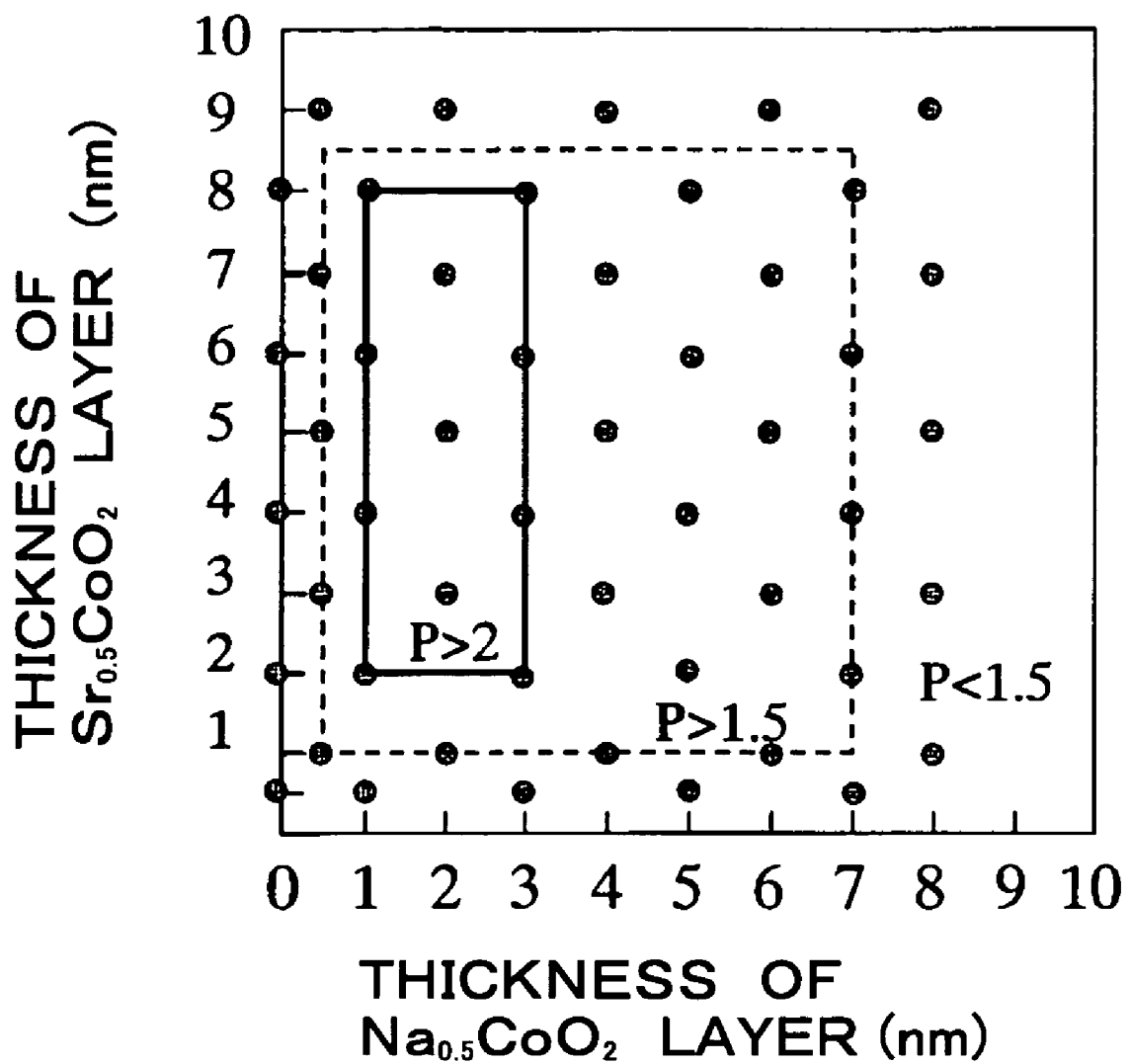
FIG. 2 is a diagram showing the correlation between the thickness of an $A_xCoO_2$ layer forming a thermoelectric transducing material according to the mode for carrying out the present invention and thermoelectric transduction power factor P.

FIG. 2 is a diagram showing the correlation between the thickness of an $A_xCoO_2$ layer forming a thermoelectric transducing material and the thermoelectric trasduction power factor P. In this example the thermoelectric trasduction power factor P was measured at room temperature. As can be seen from FIG. 2, a region in which a thermoelectric trasduction power factor P of 2 mW/K$^2$m or more, which is particularly excellent, was obtained is limited to within a certain layer thickness range. As confirmed from FIG. 2, the thickness of a $Na_{0.5}CoO_2$ layer is preferably not less than 1 nm and not more than 3 nm, while the thickness of a $Sr_{0.5}CoO_2$ layer is preferably not less than 2 nm and not more than 8 nm.

A layered structure of $A'_{0.5}CoO_2$ layer and $A''_{0.5}CoO_2$ layer in which other alkali metal element and alkali earth group element were used as A' and A", respectively, also had the same tendency as above, though the absolute value of thermoelectric trasduction power factor P was different.

It will be apparent from the foregoing description that many improvements and other embodiments of the present invention occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

What is claimed is:

1. A thermoelectric transducing material comprising a layered cobaltite based substance represented by the chemical formula $A_xCoO_2$, wherein x is not less than 0.2 and not more than 1 and wherein A consists of an element selected from the group consisting of Na, K, Sr, Ca and Ba, and is compositionally modulated in a thickness-wise direction of layers in a structure of the layered cobaltite based substance.

2. The thermoelectric transducing material according to claim 1, wherein x is not less than 0.3 and not more than 0.7.

3. The thermoelectric transducing material according to claim 3, wherein x is not less than 0.4 and not more than 0.6.

4. The thermoelectric transducing material according to claim 1, wherein the layering of $A_xCoO_2$ layers corresponding to the respective kinds of elements or element groups is repeated in a layering direction.

5. The thermoelectric transducing material according to claim 1, wherein the thermoelectric transducing material comprises plural kinds of element A, and A is compositionally modulated by layering $A_xCoO_2$ layers corresponding to the respective kinds of elements or element groups.

6. The thermoelectric transducing material according to claim 1, wherein the thermoelectric transducing material comprises plural kinds of element A.

7. A thermoelectric transducing material comprising a plural layered cobaltite based substance, at least one layer represented by the chemical formula $A'_xCoO_2$ and at least one other layer represented by the formula $A''_xCoO_2$, wherein x is not less than 0.2 and not more than 1 and wherein A' and A" each consists of an element selected from the group consisting of Na, K, Sr, Ca and Ba, the layered cobaltite based substance is structured such that at least one $A'_xCoO_2$ layer and at least one $A''_xCoO_2$ layer are stacked in a layer thickness direction, and is compositionally modulated in a thickness-wise direction of layers in a structure of the layered cobaltite based substance and A' and A" are different elements.

8. The thermoelectric transducing material according to claim 7, wherein A' is an alkali metal element and A" is an alkaline earth element.

9. The thermoelectric transducing material according to claim 8, wherein a thermoelectric transduction power factor P is 1.5 $mW/K^2m$ or more.

10. The thermoelectric transducing material according to claim 7, wherein A' is an element or element group consisting of an alkali metal element and a thickness of the $A'_xCoO_2$ layer is not less than 1 nm and not more than 3 nm.

11. The thermoelectric transducing material according to claim 7, wherein A" is an element or element group consisting of an alkali earth group element and a thickness of the $A''_xCoO_2$ layer is not less than 2 nm and not more than 8 nm.

12. The thermoelectric transducing material according to claim 7, wherein a thickness of the $A'_xCoO_2$ layer is not less than 1 nm and not more than 3 nm, while a thickness of the $A''_xCoO_2$ layer is not less than 2 nm and not more than 8 nm.

13. The thermoelectric transducing material according to claim 12, wherein the thermoelectric transduction power factor P is 2 $mW/K^2m$ or more.

14. The thermoelectric transducing material according to claim 7, wherein A' is Na and A" is Sr.

15. The thermoelectric transducing material according to claim 7, wherein A' is Na and A" is K.

16. The thermoelectric transducing material according to claim 7, wherein A' is Na and A" is Ca.

17. The thermoelectric transducing material according to claim 7, wherein A' is Na and A" is Ba.

18. The thermoelectric transducing material according to claim 7, wherein A' is K and A" is Ca.

19. The thermoelectric transducing material according to claim 7, wherein A' is K and A" is Sr.

20. The thermoelectric transducing material according to claim 7, wherein A' is K and A" is Ba.

21. The thermoelectric transducing material according to claim 7, wherein A' is Ca and A" is Sr.

22. The thermoelectric transducing material according to claim 7, wherein A' is Ca and A" is Ba.

23. The thermoelectric transducing material according to claim 7, wherein A' is Sr and A" is Ba.

* * * * *

UNITED STATES PATENT AND TRADEMARK OFFICE
CERTIFICATE OF CORRECTION

PATENT NO. : 7,067,205 B2  
APPLICATION NO. : 10/730096  
DATED : June 27, 2006  
INVENTOR(S) : Hideaki Adachi et al.

It is certified that error appears in the above-identified patent and that said Letters Patent is hereby corrected as shown below:

Under "What is claimed is:",

Column 9, line 32, change " claim 3 " to -- claim 1 --

Signed and Sealed this

Tenth Day of April, 2007

JON W. DUDAS  
*Director of the United States Patent and Trademark Office*